(12) United States Patent
Hartman et al.

(10) Patent No.: US 9,730,354 B2
(45) Date of Patent: Aug. 8, 2017

(54) SYSTEMS AND METHODS FOR COUPLING A CIRCUIT BOARD TO AN INFORMATION HANDLING SYSTEM CHASSIS

(71) Applicant: Dell Products L.P., Round Rock, TX (US)

(72) Inventors: Corey Dean Hartman, Hutto, TX (US); Michael Dennis Marcade, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/457,324

(22) Filed: Aug. 12, 2014

(65) Prior Publication Data

US 2016/0050786 A1 Feb. 18, 2016

(51) Int. Cl.
| | | |
|---|---|---|
| *H05K 7/00* | (2006.01) | |
| *H05K 5/00* | (2006.01) | |
| *H05K 7/14* | (2006.01) | |
| *H05K 1/02* | (2006.01) | |
| *H05K 1/11* | (2006.01) | |

(52) U.S. Cl.
CPC ......... *H05K 7/1417* (2013.01); *H05K 1/0215* (2013.01); *H05K 7/1405* (2013.01); *H05K 1/115* (2013.01); *H05K 2201/10295* (2013.01)

(58) Field of Classification Search
CPC ...................................................... H05K 7/142
USPC ....................................... 361/679.01–679.03
See application file for complete search history.

(56) References Cited

U.S. PATENT DOCUMENTS

| | | | | |
|---|---|---|---|---|
| 5,381,314 A | * | 1/1995 | Rudy, Jr. ............. | H05K 9/0016 257/729 |
| 6,186,800 B1 | * | 2/2001 | Klein ...................... | H01R 4/64 174/51 |
| 6,345,994 B1 | * | 2/2002 | Johnson ................ | H05K 7/142 174/51 |

\* cited by examiner

*Primary Examiner* — Jerry Wu
(74) *Attorney, Agent, or Firm* — Jackson Walker L.L.P.

(57) ABSTRACT

In accordance with embodiments of the present disclosure, an information handling system may include a chassis and a circuit board. The chassis may have one or more structural posts. The circuit board may mechanically couple to the chassis, and the circuit board may comprise a substrate having formed therein one or more through-holes and one or more hooks each configured to mechanically couple the circuit board to the chassis via a corresponding structural post of the one or more structural posts, each of the one or more hooks comprising one or more mounting features, wherein each of the one or more mounting features is sized and shaped to engage with a corresponding one of the one or more through-holes in order to mechanically couple such hook to the substrate.

22 Claims, 5 Drawing Sheets

SYSTEMS AND METHODS FOR COUPLING A CIRCUIT BOARD TO AN INFORMATION HANDLING SYSTEM CHASSIS

TECHNICAL FIELD

The present disclosure relates to modular information handling systems. More specifically, embodiments of the disclosure provide systems and methods for coupling a circuit board to an information handling system chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis.

In an information handling system, a circuit board may mechanically and electrically couple to another circuit board (e.g., a midplane or motherboard) via an edge connector that coupled to a slot of the other circuit board, with additional mechanical support provided between the circuit board and a chassis housing components of the information handling system. Such additional support may be required where the mechanical support provided by coupling the edge connector to its corresponding slot is insufficient. For instance, in a circuit board which functions as a backplane for receiving modular hard disk drives, such structural attachment between circuit board and chassis may be desired to prevent backplane deflection when hard disk drives are added or removed from the backplane.

In traditional approaches, to provide such mechanical coupling between circuit board and chassis, a circuit board may include one or more holes or openings formed therein and configured to interface with hooks extending from a chassis which provide mechanical support to the circuit board, or configured to receive screws or other fasteners for mechanically coupling the circuit board to the chassis. However, such traditional approaches may have problems and disadvantages. For example, space required for the one or more holes/openings in traditional approaches reduces the amount of routing of electrically conductive traces that would otherwise be available in the absence of such holes/openings.

SUMMARY

In accordance with the teachings of the present disclosure, the disadvantages and problems associated with traditional approaches to mechanically coupling a circuit board to a chassis may be substantially reduced or eliminated.

In accordance with embodiments of the present disclosure, a circuit board may include a substrate and one or more hooks. The substrate may have formed therein one or more through-holes. The one or more hooks may each configured to mechanically couple the circuit board to a chassis via a corresponding structural post of the chassis, each of the one or more hooks comprising one or more mounting features, wherein each of the one or more mounting features is sized and shaped to engage with a corresponding one of the one or more through-holes in order to mechanically couple such hook to the substrate.

In accordance with these and other embodiments of the present disclosure, a method may include forming one or more through-holes in a circuit board substrate and mechanically coupling one or more hooks to the substrate. Each of the one or more hooks may be configured to mechanically couple the circuit board to a chassis via a corresponding structural post of the chassis and each of the one or more hooks may comprise one or more mounting features, further wherein each of the one or more mounting features is sized and shaped to engage with a corresponding one of the one or more through-holes in order to mechanically couple such hook to the substrate.

In accordance with these and other embodiments of the present disclosure, an information handling system may include a chassis and a circuit board. The chassis may have one or more structural posts. The circuit board may mechanically couple to the chassis, and the circuit board may comprise a substrate having formed therein one or more through-holes and one or more hooks each configured to mechanically couple the circuit board to the chassis via a corresponding structural post of the one or more structural posts, each of the one or more hooks comprising one or more mounting features, wherein each of the one or more mounting features is sized and shaped to engage with a corresponding one of the one or more through-holes in order to mechanically couple such hook to the substrate.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
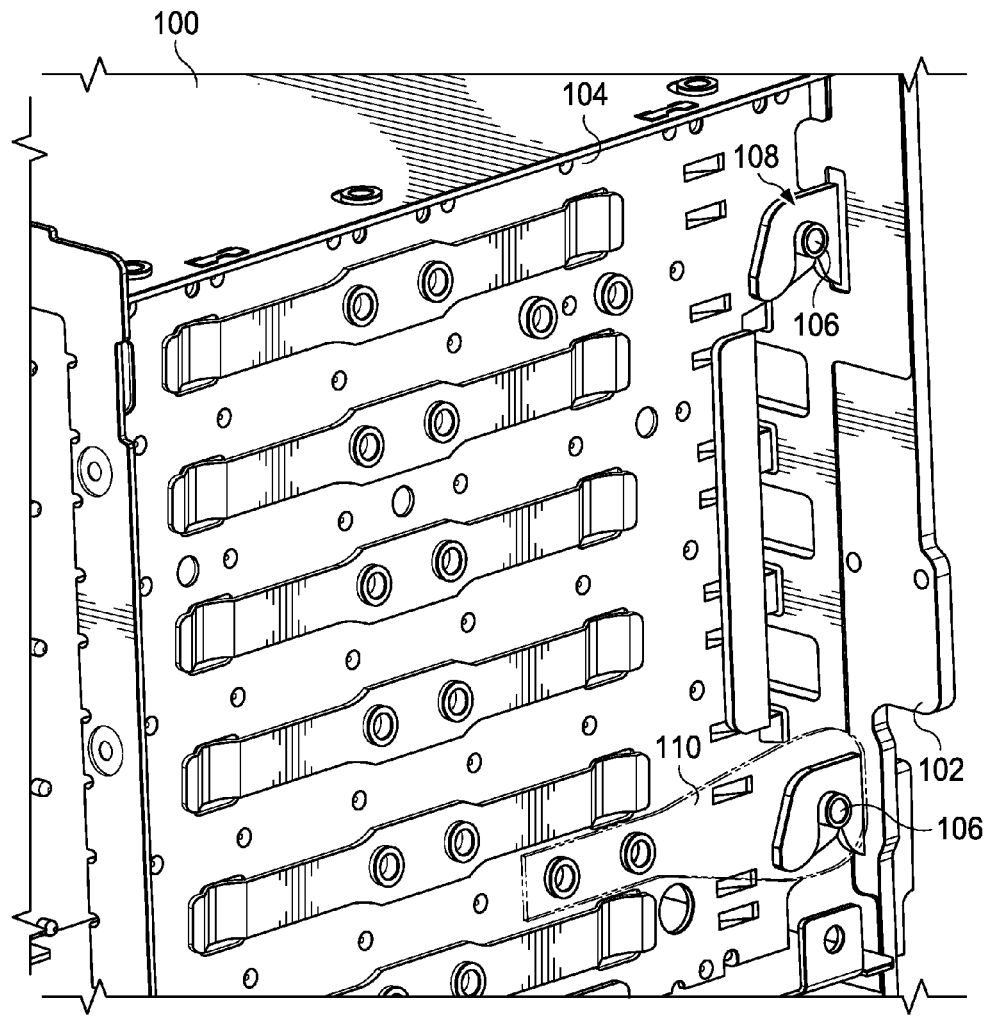
FIG. 1 illustrates a perspective view of a portion of an interior of an example chassis, in accordance with embodiments of the present disclosure.
Figure 2:
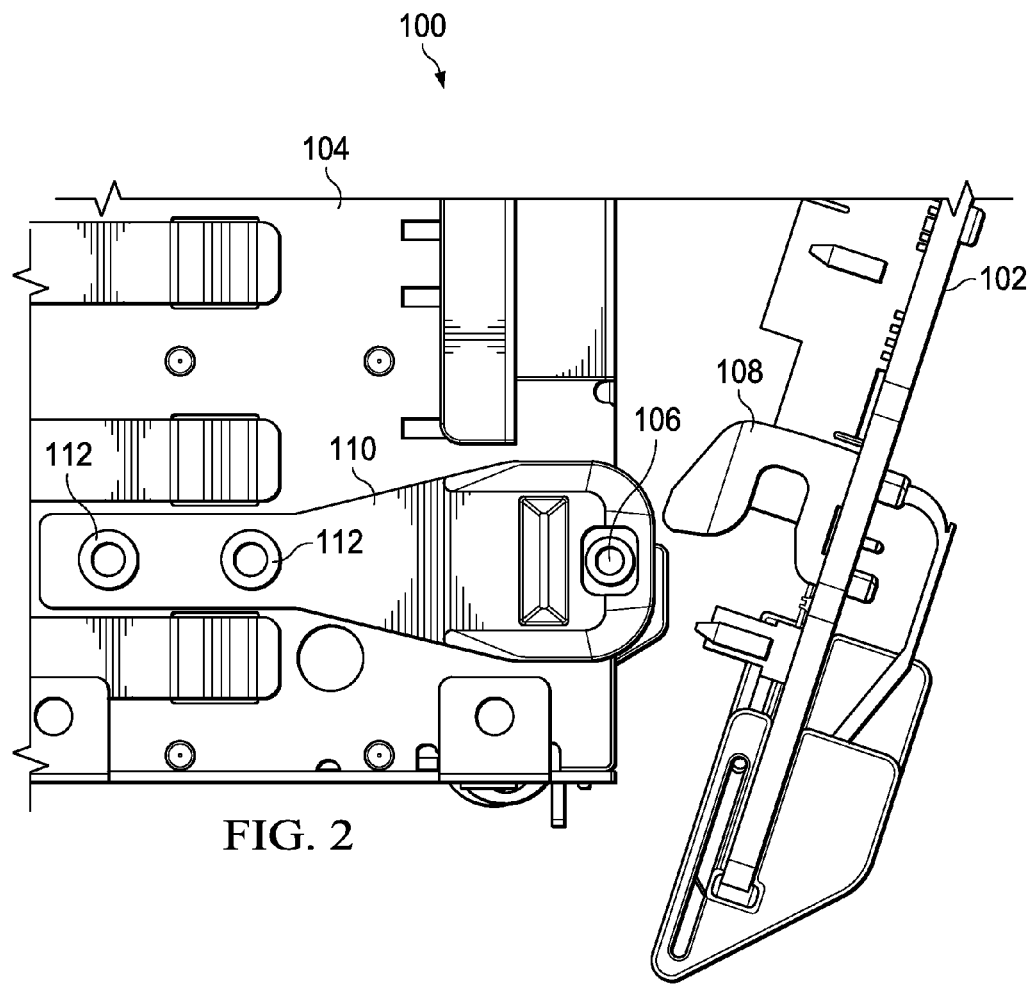
FIG. 2 illustrates a side view of the portion of the interior of the chassis depicted in FIG. 1 and further illustrating placement of a circuit board within the chassis, in accordance with embodiments of the present disclosure.
Figure 3:
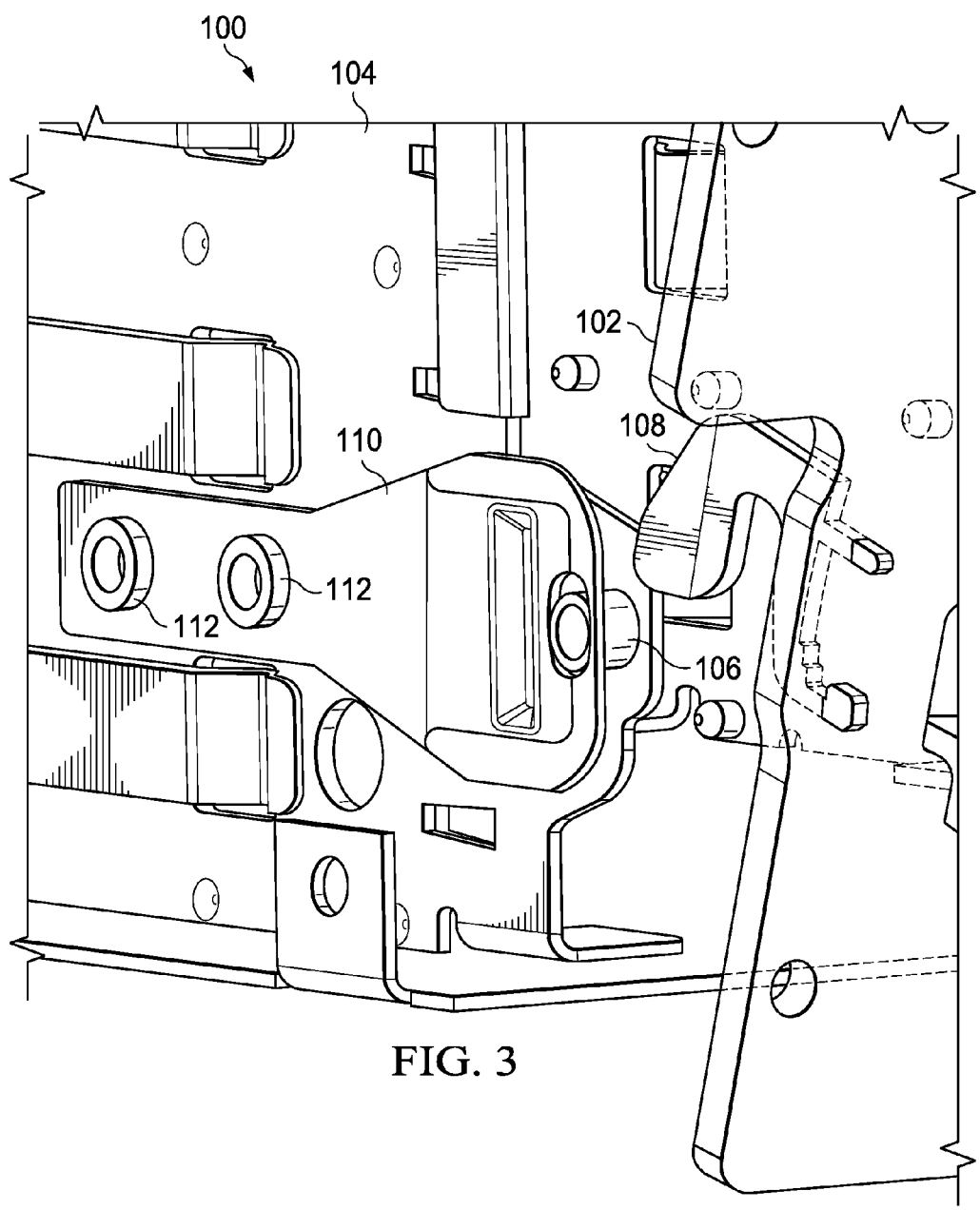
FIG. 3 illustrates a perspective view of the portion of the interior of the chassis depicted in FIG. 1 and further illustrating placement of a circuit board within the chassis, in accordance with embodiments of the present disclosure.

FIGS. 1-3 illustrate various views of a portion of an interior of a chassis 100 for housing information handling resources of an information handling system, in accordance with embodiments of the present disclosure. For example, FIG. 1 illustrates a perspective view of a portion of the interior of chassis 100, FIG. 2 illustrates a side view of the portion of the interior of chassis 100 depicted in FIG. 1 which further illustrates the placement of a circuit board 102 within chassis 100, and FIG. 3 illustrates a perspective view of the portion of the interior of chassis 100 depicted in FIG. 1 which also further illustrates placement of circuit board 102 within chassis 100.

Chassis 100 may comprise an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources.

As shown in FIGS. 1-3, chassis 100 may include one or more structural members 104, each structural member 104 having coupled thereto one or more structural posts 106, one or more alignment features 112, and one or more chassis grounding tabs 110, wherein each chassis grounding tab 110 may be placed in proximity to a corresponding structural post 106. To aid the reader, a chassis grounding tab 110 that may otherwise be present near the "top" structural post 106 is removed from FIG. 1.

A structural member 104 may comprise any suitable structural components for providing mechanical support within chassis 100. In some embodiments, structural member 104 may be thought of as a "wall" (e.g., a vertical wall in some embodiments) for housing information handling resources and/or providing mechanical support for placement of information handling resources within chassis 100. Structural member 104 may be constructed from an electrically-conductive material (e.g., aluminum, steel, or other metal) and, like other portions of chassis 100, may be electrically coupled to a ground potential.

Each structural post 106 may extend substantially perpendicularly from structural member 104. As is described in greater detail below, each structural post 106 may be configured to receive a corresponding hook 108 of a circuit board 102 to allow such circuit board 102 to be mechanically supported by chassis 100 via such hooks 108 and corresponding structural posts 106. In FIGS. 1-3, structural posts 106 are shown as cylindrically-shaped members. However, in some embodiments, structural posts 106 may have any other suitable shape.

Each alignment feature 112 may extend substantially perpendicularly from structural member 104. As is described in greater detail below, each alignment feature 112 may be configured to receive a corresponding opening 402 (see FIG. 4) of a chassis grounding tab 110 to attach chassis grounding tab 110 to structural member 104 and ensure a desired alignment of chassis grounding tab 110 relative to the rest of structural member 104.

Each chassis grounding tab 110 may be constructed from an electrically-conductive material (e.g., aluminum, steel, or other metal) and may be mechanically coupled to structural member 104 in any suitable manner, including without limitation via an adhesive, via a fastener (e.g., screw), via a weld, and/or other manner. Each chassis grounding tab 110 may be mechanically coupled to structural member 104 in such a manner that such chassis grounding tab 110 is also electrically coupled to structural member 104 such that grounding tab 110 is electrically coupled to ground potential. In FIGS. 1-3, alignment features 112 are shown as cylindrically-shaped members. However, in some embodiments, alignment features 112 may have any other suitable shape. When a corresponding hook 108 of a circuit board 102 is coupled to chassis 100 via a structural post 106, the chassis grounding tab 110 proximate to such structural post 106 may, as described in greater detail below with respect to FIG. 4, maintain contact with hook 108 such that hook 108 is electrically coupled to ground potential.

Figure 4:
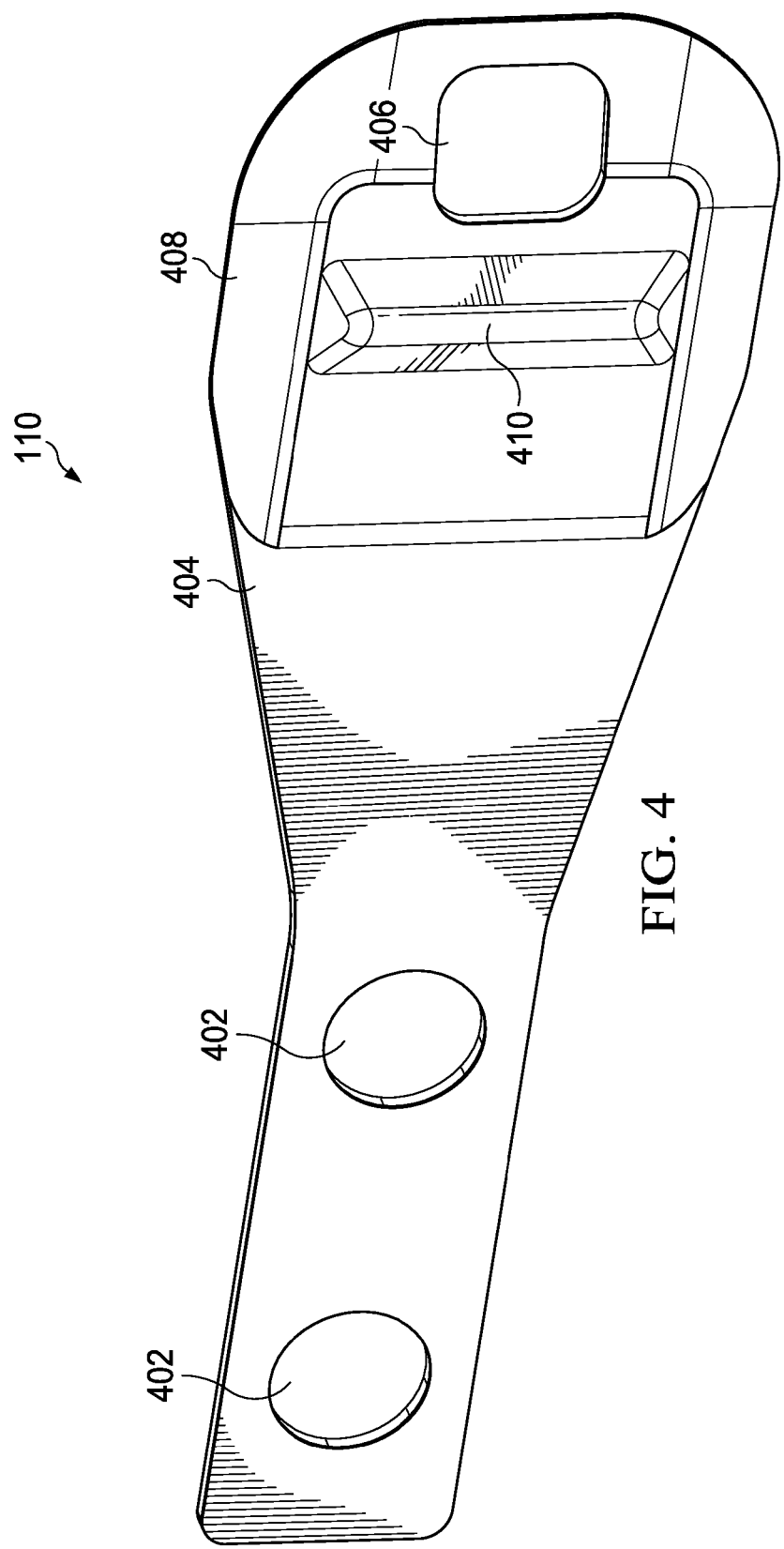
FIG. 4 illustrates an example chassis grounding tab, in accordance with embodiments of the present disclosure.

FIG. 4 illustrates an example chassis grounding tab 110, in accordance with embodiments of the present disclosure. As shown in FIG. 4, chassis grounding tab 110 may include one or more alignment openings 402, a web 404, a post pass-through opening 406, a lead-in feature 408, and a contact emboss 410.

Each alignment opening 402 may be sized and shaped to interface with corresponding alignment features 112 in order to provide desired alignment of chassis grounding tab 110 relative to structural member 104.

Web 404 may mechanically couple a first end of chassis grounding tab 110 comprising alignment openings 402 to a second end of chassis grounding tab 110 comprising post pass-through opening 406, lead-in feature 408, and contact emboss 410. In some embodiments, web 404 may be constructed with spring-like properties that may bias the second end of chassis grounding tab 110 in a direction towards structural member 104.

Post pass-through opening 406 may be sized and shaped to allow a corresponding structural post 106 to pass through such post pass-through opening 406 so as to allow a range of mechanical deflection of chassis grounding tab 110 to be unimpeded by structural post 106.

Lead-in feature 408 may comprise a sloping feature that at the edges of chassis grounding tab 110 proximate to post pass-through opening 406 slopes in a direction away from structural member 104. As a corresponding hook 108 is engaged with lead-in feature 408, lead-in feature 408 may cause the second end of chassis grounding tab 110 to oppose the spring force of web 404 and deflect in a direction away from structural member 104, such that hook 108 may engage with a corresponding structural post 106 with little resistance from chassis grounding tab 110.

Contact emboss 410 may comprise a raised feature formed on chassis grounding tab 110 that, when a corresponding hook 108 is engaged with a corresponding structural post 106, the spring force of web 404 causes contact emboss 410 to maintain contact with hook 108, thus ensuring hook 108 is electrically coupled to a ground potential.

Turning again to FIGS. 1-3, circuit board 102 may be mechanically coupled to chassis 100 via one or more hooks 108. As discussed above in the Background section, an information handling system may include one or more circuit boards operable to mechanically support and electrically connect electronic components making up the information handling system (e.g., packaged integrated circuits, slot connectors, etc.). Circuit boards may be used as part of motherboards, memories, storage devices, storage device controllers, peripherals, peripheral cards, network interface cards, and/or other electronic components. As used herein, the term "circuit board" includes printed circuit boards (PCBs), printed wiring boards (PWBs), printed wiring assemblies (PWAs), etched wiring boards, and/or any other board or similar physical structure operable to mechanically support and electrically couple electronic components. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 5:
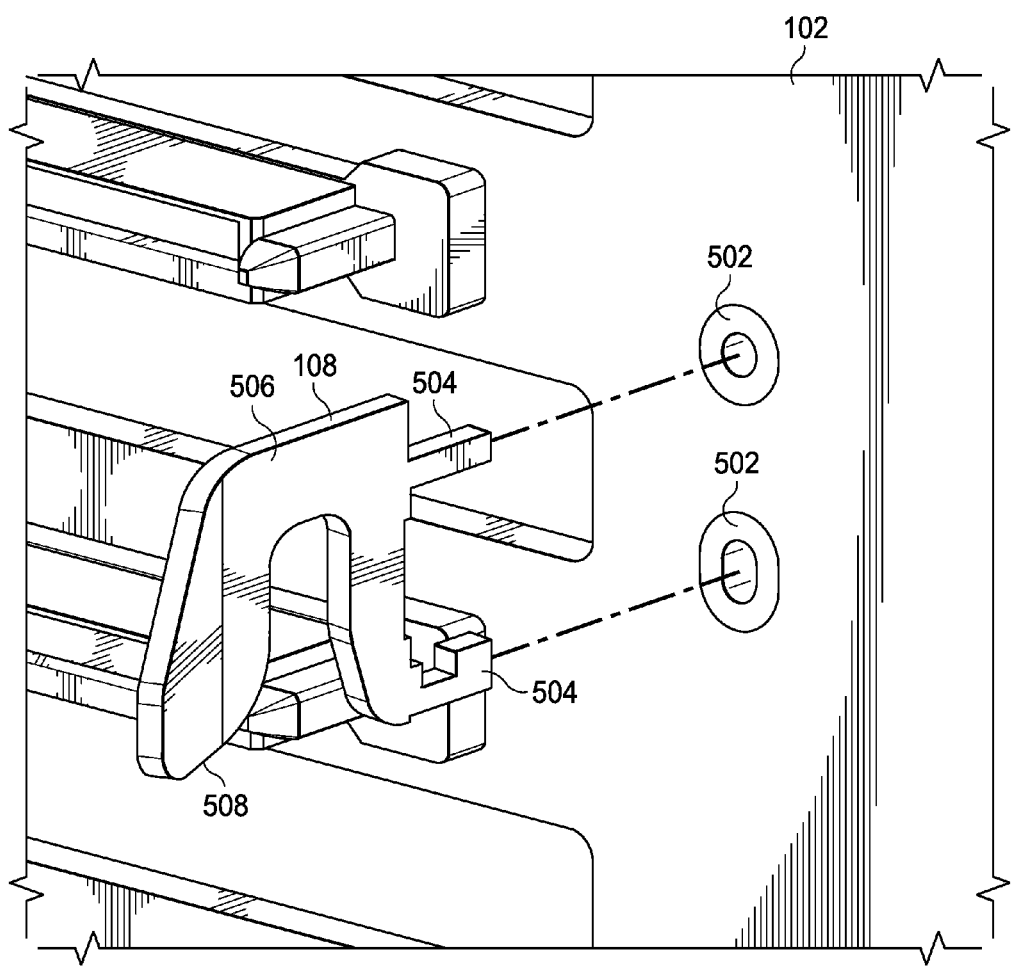
FIG. 5 illustrates an exploded perspective view of a portion of an example circuit board, in accordance with embodiments of the present disclosure.

FIG. 5 illustrates an exploded perspective view of a portion of an example circuit board 102, in accordance with embodiments of the present disclosure. As shown in FIG. 5, circuit board 102 may include through-holes 502 and hook 108.

Through-holes 502 may comprise any suitable openings formed in a substrate of circuit board 102 for receiving corresponding mounting features 504 of hook 108. In some embodiments, each through-hole 502 may be plated with a conductive material (e.g., aluminum, steel, or other metal).

Hook 108 may be mechanically coupled to circuit board 102 and may be constructed from an electrically-conductive material (e.g., aluminum, steel, or other metal). As shown in FIG. 5, hook 108 may include mounting features 504, contour feature 506, and lead-in feature 508.

Each mounting feature 504 may extend from the remainder of hook 108 and be sized and shaped to engage with a corresponding through-hole 502. Accordingly, hook 108 may be coupled to circuit board 102 by passing mounting features 504 through their respective through-holes 502 and applying solder or other suitable material to fixedly couple mounting features 504 within through-holes 502.

Contour feature 506 may comprise a U-shaped or similar shaped feature configured to engage with a corresponding structural post 106, such that circuit board 102 essentially hangs from chassis 100 when so engaged. Contour feature 506 and other portions of hook 108 may also be sized and shaped so as to align circuit board 102 in a desired position with respect to chassis 100. For example, in some embodiments circuit board 102 may comprise a backplane for receiving hard disk drives and structural member 104 may include a wall of a hard disk drive bay. In such embodiments, contour feature 506 and other portions of hook 108 may also be sized and shaped so as to align circuit board 102 in a desired position with respect to chassis 100 such that when hard disk drives are placed into the hard disk drive bay, connectors of the individual disk drives are aligned with corresponding connectors of the backplane.

Lead-in feature 508 may comprise a sloping feature on the edge of the U-shaped contour feature 506 that slopes in a direction away from circuit board 102. As hook 108 is engaged with a corresponding structural post 106, lead-in feature 508 may allow for ease of assembly of printed circuit board 102 to chassis 100.

It is noted that the views of FIGS. 1 through 5 depict the coupling of a circuit board 102 to a chassis 100 at one edge of circuit board 102, and that identical or similar features may be present at an opposite side of circuit board 102 or at an intermediate position within circuit board 102.

Hooks 108 and/or through-holes 502 may be designed so as to have minimal impact to circuit board 102 in order to enable maximum board and signal routing density.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A circuit board comprising:
   a substrate having formed therein one or more through-holes; and
   one or more hooks each configured to mechanically couple the circuit board to a chassis, each hook comprising one or more mounting features and a contour configured to engage with a structural post coupled to and extending substantially perpendicularly from a structural member of the chassis, with the structural post supporting the hook, the contour lying generally in a plane perpendicular to a substantially planar surface of the substrate to which the one or more hooks are mounted, wherein each of the one or more mounting features is sized and shaped to engage with a corresponding one of the one or more through-holes in order to mechanically couple such hook to the substrate.

2. The circuit board of claim 1, wherein at least one of the one or more through-holes is plated with an electrically-conductive material.

3. The circuit board of claim 1, wherein each of the one or more mounting features is mechanically coupled to one of the one or more through-holes with solder.

4. The circuit board of claim 1, wherein the contour is sized and shaped so as to align the circuit board in a desired position with respect to the chassis.

5. The circuit board of claim 1, wherein at least one of:
   the one or more hooks; and
   the one or more through-holes;
   are designed to have a minimal impact to the substrate in order to enable maximum board and signal routing density for the circuit board.

6. A method comprising:
   forming one or more through-holes in a circuit board substrate; and
   mechanically coupling one or more hooks to the substrate, wherein:
      each hook is configured to mechanically couple the circuit board to a chassis;
      each hook comprises one or more mounting features, further wherein each of the one or more mounting features is sized and shaped to engage with a corresponding one of the one or more through-holes mechanically coupling the hook to the substrate; and
      each hook comprises a contour configured to engage with a corresponding structural post coupled to and extending substantially perpendicularly from a structural member of the chassis, with the structural post supporting the hook, the contour lying generally in a plane perpendicular to a substantially planar surface of the substrate to which the hook is mounted.

7. The method of claim 6, further comprising plating at least one of the one or more through-holes with an electrically-conductive material.

8. The method of claim 6, further comprising mechanically coupling each of the one or more mounting features to one of the one or more through-holes with solder.

9. The method of claim 6, wherein the contour is sized and shaped so as to align the circuit board in a desired position with respect to the chassis.

10. The method of claim 6, further comprising:
    designing at least one of:
      the one or more hooks; and
      the one or more through-holes;
    to have a minimal impact to the substrate in order to enable maximum board and signal routing density for the circuit board.

11. An information handling system comprising:
    a chassis having one or more structural posts coupled to and extending substantially perpendicularly from a structural member of the chassis; and
    a circuit board mechanically coupled to the chassis, the circuit board comprising:
      a substrate having formed therein one or more through-holes; and
      one or more hooks, each hook configured to mechanically couple the circuit board to the chassis, each of the one or more hooks comprising one or more mounting features and a contour configured to engage with a corresponding one of the one or more structural posts with the structural post supporting the hook, the contour lying generally in a plane perpendicular to a substantially planar surface of the substrate to which the hook is mounted, wherein each of the one or more mounting features is sized and shaped to engage with a corresponding one of the one or more through-holes in order to mechanically couple the hook to the substrate.

12. The information handling system of claim 11, wherein at least one of the one or more through-holes is plated with an electrically-conductive material.

13. The information handling system of claim 11, wherein each of the one or more mounting features is mechanically coupled to one of the one or more through-holes with solder.

14. The information handling system of claim 11, wherein the contour is sized and shaped so as to align the circuit board in a desired position with respect to the chassis.

15. The information handling system of claim 11, further comprising one or more chassis grounding tabs mechanically and electrically coupled to the chassis, each chassis grounding tab configured to maintain contact with a corresponding hook of the one or more hooks when the corresponding hook is engaged with its corresponding structural post, in order to electrically couple the corresponding hook to the chassis.

16. The information handling system of claim 15, wherein at least one of the one or more chassis grounding tabs includes a spring force to bias the chassis grounding tab to maintain contact with its corresponding hook when the corresponding hook is engaged with its corresponding structural post.

17. The information handling system of claim 16, wherein the at least one of the one or more chassis grounding tabs comprises a lead-in feature shaped to cause a portion of the chassis grounding tab to oppose the spring force of the chassis grounding tab and cause the portion to deflect in a direction away from the chassis to allow the corresponding hook to engage with its corresponding structural post.

18. The information handling system of claim 15, wherein the at least one of the one or more chassis grounding tabs comprises an emboss formed thereon configured to maintain contact with a corresponding hook of the one or more hooks when the corresponding hook is engaged with its corresponding structural post, in order to electrically couple the corresponding hook to the chassis.

19. The information handling system of claim 15, wherein:
   the chassis further comprises one or more alignment features; and
   at least one of the one or more chassis grounding tabs comprises one or more alignment openings each sized and shaped to interface with a corresponding alignment feature of the one or more alignment features in order to provide desired alignment of the chassis grounding tab relative to the chassis.

20. The information handling system of claim 11, wherein the contour comprises a U-shaped feature having a closed end and an open end and wherein the one or more hooks each comprise at least one lead-in feature having a sloping feature on the edge of the contour wherein a point on the sloping feature proximal to the closed end of the U-shaped feature is closer to the substrate than a point on the sloping feature proximal to the open end of the U-shaped feature.

21. The circuit board of claim 1, wherein the contour comprises a U-shaped feature having a closed end and an open end and wherein the one or more hooks each comprise at least one lead-in feature having a sloping feature on the edge of the contour wherein a point on the sloping feature proximal to the closed end of the U-shaped feature is closer to the substrate than a point on the sloping feature proximal to the open end of the U-shaped feature.

22. The method of claim 6, wherein the contour comprises a U-shaped feature having a closed end and an open end and wherein the one or more hooks each comprise at least one lead-in feature having a sloping feature on the edge of the contour wherein a point on the sloping feature proximal to the closed end of the U-shaped feature is closer to the substrate than a point on the sloping feature proximal to the open end of the U-shaped feature.

\* \* \* \* \*